United States Patent [19]
Lazzari

[11] 4,350,743
[45] * Sep. 21, 1982

[54] STRUCTURE FOR MULTILAYER CIRCUITS

[75] Inventor: Jean-Pierre Lazzari, Montfort l'Amaury, France

[73] Assignee: Compagnie Internationale pour l'Informatique CII-Honeywell Bull (Societe Anonyme)

[*] Notice: The portion of the term of this patent subsequent to Feb. 19, 1997, has been disclaimed.

[21] Appl. No.: 211,678

[22] Filed: Dec. 1, 1980

Related U.S. Application Data

[63] Continuation of Ser. No. 55,497, Jul. 6, 1979, abandoned, which is a continuation of Ser. No. 792,210, Apr. 29, 1977, Pat. No. 4,189,524.

[30] Foreign Application Priority Data

May 6, 1976 [FR] France ............... 76 13553

[51] Int. Cl.³ ............................................. G23P 3/00
[52] U.S. Cl. ..................................... 428/622; 174/68.5; 428/213; 428/448; 428/457; 428/901; 428/630
[58] Field of Search ............... 428/622, 630, 213, 448, 428/450, 457, 901; 174/68.5; 361/411; 427/96; 357/71

[56] References Cited

U.S. PATENT DOCUMENTS

| | | | |
|---|---|---|---|
| Re. 29,326 | 7/1977 | Lazzari | 360/123 |
| 3,461,357 | 8/1969 | Mutter et al. | 357/71 |
| 3,723,665 | 3/1973 | Lazzari | 360/123 |
| 3,751,292 | 8/1973 | Kongable | 357/69 |
| 3,808,049 | 4/1974 | Caley | 361/411 |
| 3,844,831 | 10/1974 | Cass et al. | 427/89 |
| 3,846,841 | 11/1974 | Lazzari | 360/123 |
| 3,983,284 | 9/1976 | Croset | 428/195 |
| 4,045,594 | 8/1977 | Maddocks | 430/314 |
| 4,090,006 | 5/1978 | Havas et al. | 428/81 |
| 4,107,726 | 8/1978 | Schilling | 357/71 |

OTHER PUBLICATIONS

Noubel et al., "Metallurgy Including a Chromium Slice", IBM TDB, vol. 11, No. 7, Dec. 1968, p. 769.

Primary Examiner—John D. Smith
Attorney, Agent, or Firm—Kerkam, Stowell, Kondracki & Clarke

[57] ABSTRACT

To reduce the proportion of rejects resulting by reasons of short circuits in the manufacture and use of miniaturized multilayer circuits and to improve the electric efficiency, there is inserted between each conductive layer of low resistance and each insulating layer of high thermal stability, a very thin layer of a conductive material, preferably non-magnetic, of high resistivity and of crystallographic reference at least compatible with respect to the first conductive material and of low or negligible thermal expansion in the range of temperatures to which the circuits are submitted both during manufacture and use.

6 Claims, 3 Drawing Figures

STRUCTURE FOR MULTILAYER CIRCUITS

CROSS REFERENCES TO RELATED APPLICATIONS

This application is a continuation of applicaion of Ser. No. 55,497, filed July 6, 1979 and now abandoned which in turn is a continuation of my prior filed and copending application Ser. No. 792,210, filed on Apr. 29, 1977 now U.S. Pat. No. 4,189,524, which is in turn, the parent of divisional application Ser. No. 12,450, filed Feb. 15, 1979 now U.S. Pat. No. 4,311,727.

BACKGROUND OF THE INVENTION

The present invention has for its object an improved structure of multilayer circuits useful in the technological field of miniaturized electric components.

Multilayer circuits are normally constituted of a stack of thin layers, alternately conductive and insulating, which are deposited in superposition, one atop the other, by any suitable means, such as well known chemical, aqueous, or vacuum deposition processes and all others, all such procedures coming within the resin of the invention which seeks to correct defects which occur regardless of the technology utilized for the deposition of the layers.

These thin layers may, as required, be conformed during and with respect to the production of the stack to obtain desired volumetric electric circuit configurations. The term "thin layer" is intended here in its presently accepted meaning: layers of which the thicknesses are located from a few several hundreds of angstroms up to a small number of microns, less than 10.

A particular problem with respect to such multilayer circuits is that of short circuits which occur either during manufacture or in use. The elimination or minimization of short circuits is important, not only from the economics of manufacture, but also from the stand point of the reliability of the products.

In a general way, it is desirable that in multilayer circuits the conductive layers be relatively as thick as possible and the interposed insulating layers, relatively as thin as possible so that their electric efficiency is high. The short circuits appear more frequently as the insulating layers are made thinner, but it can also be stated that the frequency of short circuits increases with the thickness of the conductive layers. This is because, whatever the technique used for deposition, the state of the surface of a conductive layer degrades as the thickness increases. The growth of crystalline nature and the mesh or size of the crystals increases rapidly with thickness primarily under the effect of the macles or twins which are produced and the accumulation of defects in the microscopic range causing most often small crystalline growths. However, a very thin layer reproduces accurately the state of the surface of the substrate on which it is deposited. It follows that when a very thin insulating layer is formed on a relatively thick conductive layer, whose surface condition is poor for the reason above discussed, the very thin insulating layer will reproduce all of the defects of the surface of the conductive layer and will prevent variations of thickness leading readily to the existence of microporosities and the appearance of short circuits.

These risks of production of short circuits during manufacture therefore introduce a limitation on the ratio of the thicknesses of the condutive and insulating layers in multilayer circuits which is by no means negligible.

Further, multilayer circuits must often support during use of equipment in which they are incorporated large elevations of temperature which can for example reach 450° C. or thereabout. However, the conductive materials currently utilized in these circuits, because they have a low resistivity favorable to the flow of electric current, are, usually, the four metals of the group of copper, aluminum, silver, gold and their alloys. Each of these standard metals has a coefficient of its thermal expansion which is relatively large, that for copper for example being 14 $10^{-6}/°$ C., and crystallize easily when the temperature increases, with grains which enlarge quickly. The lattice of the crystalline structure is therefore under considerable stresses entailing or producing the formation of fissures. Thus, a metal-insulator-metal structure can develop a short circuit when submitted to an elevation of temperature which modifies the regular crystalline structure of the metal.

The object of the invention is to eliminate the above-described difficulties and, particularly, to provide multilayer circuits with any desirble high ratio between the thicknesses of the conducting and insulating layers. The problem of the elevations of temperatures with respect to the insulating layers can be ignored since the materials usual for these insulating layers have high thermal stability at the temperature to be considered for the efficiency of the circuits.

SUMMARY OF THE INVENTION

To these ends, the invention provides for multilayer circuits of the type above-discussed a new structure essentially characterized in that it comprises between each thick layer of conductive material of low resistivity and relatively high coefficient of thermal expansion and at least the insulating layer which should separate it from the thick conductive layer following the stacking, a thin conductive layer of a conductive material having a relatively high resistivity with respect to the conductive material of low resistivity forming the conductors of the multilayer circuit, having a low thermal coefficient of expansion and a crystalline lattice and size at least close to or similar to those of the conductive material of low resistivity.

The additional thin conductive layer having these properties could be deposited only on one side of the thick conductive layer, namely, that side on which there will afterwards be formed a thin insulating layer in the course of deposition of the succeeding layers in the stack. It may be better for the final result to sandwich all thick conductive layers between two such additional thin layers in considering especially the point of view of heating during the use of the circuits.

The provision of these thin additional conductive layers assures that each very thin insulating layer of the stack will be deposited on a substrate of very good surface state and therefore at this level to prevent any appreciable microporosity in spite of its thickness ratio with respect to the conductive layer of low resistivity above which it is located would be higher than desirable for the object sought, that is the intensity of the electric current that the circuits should support during its use.

The choice of the material of the additional conductive layers assures at least and in fact reinforces the mechanical homogeneity of the multilayer because of the close crystallographic relationship between the conductive materials of the thick and thin layers. Further, when the deposition process utilized requires heat, primarily in the case of evaporation under vaccum or under controlled atmosphere, the formation of an additional conductive layer thermally more stable on the crystalline plane assures to a certain degree a reduction of the macles or twins which may have occurred during the deposit of the underlying conductive layer of low resistivity. Actually, the additional material will be doped by the material of the underlying conductive layer to a certain predetermined depth and during this dopage the superficial macles of the deposited layer will be destroyed, because their materials combine in doping with the crystals of the additional material over the said depth. Further, the interposition of the additional material has an additional advantage. Generally speaking, the conductive material of low resistivity will much more likely oxidize than the material of high resistivity forming the interposed layer. During the formation of the insulating layer, which in fact has an oxide base, in the process of depositoin by evaporation under a controlled atmosphere, the oxygen utilized could and in fact does oxidize the surface of conductive layer of low resistivity. The additional layer will avoid this inconvenience.

The utilization of the sandwich form as discussed still further reduces the occurrences of the enumerated inconveniences as to the normal conductive layers of the multilayers.

When utilizing a multilayer circuit provided in accordance with the present invention subject to large heating up to, for example 450° C., the value which is taken as a limit in practice, this heating instead of being destructive of the electric insulation acts as a simple annealing reinforcing the doping and stabilizing the multilayers with respect to short circuits and with respect to further heatings. The useful thickness of the layers of low resistivity for the normal intensities of the electric currents in use with the multilayers will be evaluated as a function of a known value in the art, knowing the facility or doping of the additional material by the less stable material from the thermal point of view, thus diffusing in the additional material.

It can therefore be provided, for example, that before any delivery for use, a multilayer of the present invention will be subjected to a systematic annealing at this maximum temperature and thereafter tested. When no short circuit is then revealed, the multilayers will have a very strong probability of reliability in use.

DESCRIPTION OF THE PREFERRED EMBODIMENTS

Figure 1:
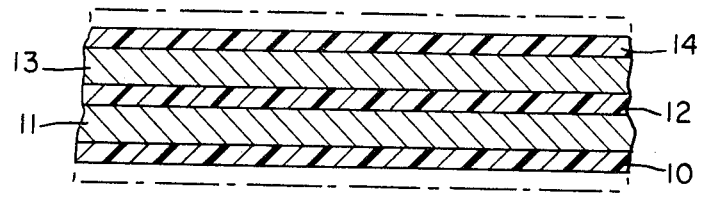
FIG. 1 is a fragmentary view, in vertical cross section, or a multilayer structure of the type known in the prior art.

As shown in FIG. 1, a multilayer circuit of the type known in the prior art is made of alternatively deposited layers one atop the other. After a thin film insulating layer 10 has been deposited over priorly formed layers (now shown), but indicated by phantom lines, a conductive material layer 11, made of a material of relatively low resistivity and relatively high thermal expansion is deposited. Over this layer 11, which is thicker than the insulating film 10, there is deposited another thin film 12 of insulating material, and, thereafter, another conductive layer 13 of identical characteristics to layer 11. Over this further conductive layer 13, a further insulating film 14 is deposited; and so forth, the remaining layers of the stack not being shown. It must be understood that each insulating film is made of a refractory material such as, mainly, silica or ceramic.

The disadvantages of this conventional stack and defects resulting thereof have been hereinbefore described.

Figure 2:
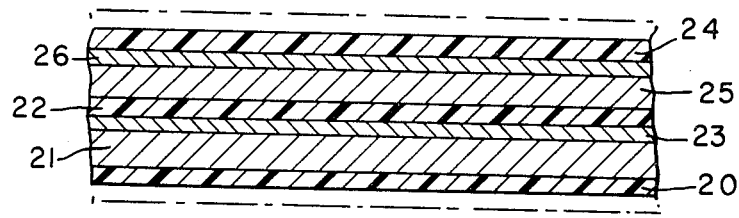
FIGS. 2 and 3 are fragmentary views, in vertical cross section, of alternative embodiments of multilayer structures made in accordance with the present invention.
Figure 3:
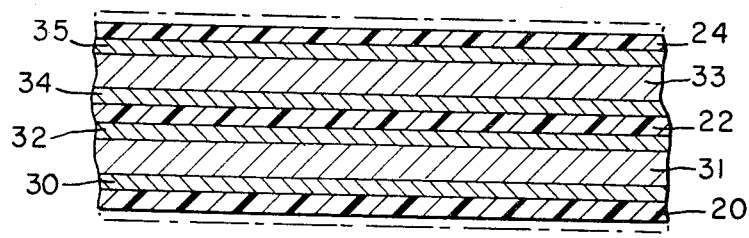

A multilayer stack made according to the teachings of the invention is shown in FIGS. 2 and 3.

In FIG. 2, between each of two insulating films 20, 22 and 22, 24, are inserted composite conductive layers, each comprised of a thicker low resistivity relatively high thermal expansion coefficient material, 21 and 25, respectively, and of a thinner layer, or film, 23 and 26, respectively, of a conductive material of relatively higher resistivity and relatively low thermal expansion coefficient. However, the materials of these two layers are so selected as to have close crystallographic characters, as it has been herein described.

In FIG. 3, between each of two insulating films 20, 22 and 22, 24, are inserted composite conductive layers, each comprised of a pair of conductive films 30, 32, respectively, and 34-35, respectively, of a relatively high resistivity and high thermal strength. Between each pair of conductive films is a thicker conductive layer 31, 33 respectively, of a material of relatively low resistivity and relatively low thermal strength, however, the materials of the said layer and films are selected to present close crystallographic characters, as herein described.

In further explanation of the invention, an example can be considered in which the conductive material having low resistivity forming the thick conductive layers is copper, the material of the additional layers is chromium and the insulating material in silica. Silica is the most common binary compound of silicon and oxygen ($SiO_2$) and an insulating refractory material. Chromium and copper have somewhat similar crystallographic characteristics. Copper crystallizes in cubic form with centered faces and chrome crystallizes in cubic form with centered bodies, the dimensions of the lattice being close in these two materials. Chromium, as known, does not expand appreciably at a temperature not above approximately 450° C. It oxidizes only little beneath this limit of temperature when heated in an oxidizing atmosphere.

Two hundred (200) specimens of multilayer circuits were formed in two series. In the first, only the usual structure was utilized, alternating regularly thick layers of copper on the order of one to four microns and thin insulating layers of silica on the order of 800 A. In the second series, the present invention was utilized by separating each thick conductive layer from each thin insulating layer by a thin layer of chromium on the order of 2000 A in thickness.

With the multilayers of the first series, the range of loss after manufacture was on the order of 8% increasing to 96% at least when then followed by an annealing of the type described above. With the multilayers of the second series the range of losses was initially on the order of 2% and was raised to only about 15% after annealing.

The above example where the materials are copper and chromium is obviously only illustrative. There is a rather large choice from the crystallographic point of view and from the electric and thermal point of view involving a certain range of limitations of choice based on the one hand on the deposition process utilized and on the other hand whether or not magnetic material can be employed in the stack.

From this last point of view all magnetic materials which would otherwise be useful—beta cobalt and nickel, for example, will be eliminated except to assure during manufacture a dopage such that the final form would be non-magnetic when required, by introduction of an additional doping element assuring such a transformation.

To manufacture multilayer circuits by application of evaporation in a controlled atmosphere, there will be eliminated bodies which evaporate badly; primarily the metalloids such as strontium, calcium, thallium and rhodium whose other characteristics of which would be compatible with the manufacture of the invention by other deposit procedures.

After the application of the elimination criteria set forth above, only simple crystalline bodies which crystallize similar to copper remain, such as, for example, chrome and titanium deposited in beta form and vanadium and their alloys, or from that formed by nickel and beta cobalt doped with the first material, for a fabrication which relies on evaporation in a controlled atmosphere and where copper is the normal conductive material in the multilayers.

On the other hand, the use of aluminum for the material of low resistivity becomes easy since, when covered with thin additional layers of the invention, it does not oxidize during the deposit of silica, whereas previously oxidizing made its use difficult.

It should be noted that the use of bodies or alloys of similar crystallography, but not identical to that of the materials of low resistivity is made possible because, by evaporation under vacuum, at least, the well-known phenomena of epitaxy comes into action in the deposit of thin layers, a phenomena which tends to cause the newly-evaporated substance to "copy" the lattice of the substance which constitutes the substrate for it.

The thickness of the additional layers need not in practive of the invention be greater than 5000 A, any more than the thicknesses of the insulating layers had, or still have, any need to be as much as a micron, since the thickness of the layers are not critical, it is obviously desirable to avoid the dissipation of the materials in industrial manufacture.

I claim:

1. A multilayer device adapted to withstand temperature elevations up to 450° C. without substantial risk of formation of short-circuits between thin conductive layers thereof separated by thinner intervening insulating layers, consisting essentially of a plurality of thin conductive layers stacked with intervening thin layers of insulating refractory material, each conductive layer comprising a composite of a first layer, a second and a third conductive layer, said first layer having a relatively low resistivity and appreciable thermal expansion coefficient and being disposed with opposite faces thereof in contact with adjacent faces of said second and third layers, the opposite faces of said second and third layers being disposed in contact with one face of a first and a second thin insulating material layer, respectively, said second and third conductive layers each being thinner than said first layer and of a conductive material having a relatively high resistivity, a negligible thermal expansion coefficient and having a crystalline structure closely compatible to the crystalline structure of the first conductive layer as regards lattices and crystal sizes.

2. A multilayer device comprising a plurality of thin insulating layers separating relatively thick conductive layers, the insulating layers preventing the formation of short-circuits between the conductive layers, each relatively thick conductive layer comprising a composite having first, second and third associated conductive layers, each first layer made of conductive material having a relatively low resistivity and being disposed between the associated second and third layers, each of the second and third layers being thinner than the associated first layer and being made of a conductive material having a higher resistivity than the conductive material in the associated first layer, and an interface area between one side of each thick conductive layer and the adjacent insulating layer being equal to an interface area between the opposite side of each thick conductive layer and its adjacent insulating layer.

3. A multilayer device comprising a plurality of thin insulating layers with relatively thick conductive layers sandwiched therebetween, the insulating layers preventing the formation of short-circuits between the conductive layers, each relatively thick conductive layer comprising a composite having first, second and third conductive layers, each of the first conductive layers being sandwiched between associated second and third condutive layers, each of the second and third conductive layers being thinner than the associated first layer and being made of a conductive material having a higher resistivity than the conductive material in the associated first layer.

4. A multilayer device according to claim 2 or 3 wherein the material of said thinner conductive second and third layers is doped at least partly with the material of said first conductive layer.

5. A device according to claim 2 or 3 wherein the material of said thinner conductive second and third layers is selected from the group formed by nickel and beta cobalt and is doped by a material selected from the group formed by copper, aluminum, silver and gold.

6. A multilayer device according to claim 1, 2 or 3 where the conductive material of each first layer is a metal or metal alloy selected from the group consisting of:

copper, aluminum, silver, gold and their alloys,
the insulating layer material is silica, and the conductive material of each second and third layer is selected from the group consisting of:
chromium, beta titanium, vanadium, and their alloys, material formed by nickel and beta cobalt doped with the material selected for the associated first layer
and/or a complementary material which inhibits their magnetic properties.

* * * * *

UNITED STATES PATENT AND TRADEMARK OFFICE
CERTIFICATE OF CORRECTION

PATENT NO. : 4,350,743
DATED : September 21, 1982
INVENTOR(S) : Jean-Pierre LAZZARI It is certified that error appears in the above-identified patent and that said Letters Patent are hereby corrected as shown below:

Claim 4, column 6, line 1, after "claim" insert --1,--;

Claim 5, column 6, line 1, after "claim" insert --4,--;

Signed and Sealed this

Twenty-third Day of November 1982

[SEAL]

Attest:

GERALD J. MOSSINGHOFF

Attesting Officer    Commissioner of Patents and Trademarks